United States Patent
Fujimoto

(10) Patent No.: US 8,749,121 B2
(45) Date of Patent: Jun. 10, 2014

(54) PIEZOELECTRIC POWER GENERATING DEVICE AND MANUFACTURING METHOD THEREOF

(71) Applicant: Murata Manufacturing Co., Ltd., Nagaokakyo (JP)

(72) Inventor: Katsumi Fujimoto, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/894,711

(22) Filed: May 15, 2013

(65) Prior Publication Data
US 2013/0249350 A1    Sep. 26, 2013

Related U.S. Application Data
(63) Continuation of application No. PCT/JP2011/075635, filed on Nov. 7, 2011.

(30) Foreign Application Priority Data
Dec. 1, 2010 (JP) ................................. 2010-268771

(51) Int. Cl.
  *H01L 41/113* (2006.01)
(52) U.S. Cl.
  USPC ......................................... 310/339; 310/332
(58) Field of Classification Search
  USPC .......................................... 310/329–332, 339
  See application file for complete search history.

(56) References Cited

U.S. PATENT DOCUMENTS

| | | | | |
|---|---|---|---|---|
| 3,858,064 A | * | 12/1974 | Schissler | 310/313 B |
| 4,494,409 A | * | 1/1985 | Kondo et al. | 73/651 |
| 7,486,004 B2 | | 2/2009 | Allan et al. | |
| 7,535,155 B2 | | 5/2009 | Ishikawa | |
| 7,880,370 B2 | * | 2/2011 | Churchill et al. | 310/339 |
| 7,898,157 B2 | * | 3/2011 | Churchill et al. | 310/339 |
| 8,198,788 B2 | | 6/2012 | Martin | |

FOREIGN PATENT DOCUMENTS

| | | |
|---|---|---|
| JP | 04049876 A | 2/1992 |
| JP | 2005507627 A | 3/2005 |
| JP | 2006067643 A | 3/2006 |
| JP | 2010517285 A | 5/2010 |

OTHER PUBLICATIONS

International Search Report and Written Opinion issued in PCT/JP2011/075635, mailed Feb. 14, 2012.

* cited by examiner

*Primary Examiner* — Derek Rosenau
(74) *Attorney, Agent, or Firm* — Dickstein Shapiro LLP

(57) ABSTRACT

A piezoelectric power generating device is provided which is capable of extracting a large amount of power without an increase in device size, even when applied with vibration of low frequency or weak external force, and which is easy to manufacture.
The piezoelectric power generating device includes a piezoelectric power generating plate including a piezoelectric plate having a polarized regions that are different in polarization direction, and a support member attached to the piezoelectric power generating plate. Further, the piezoelectric power generating plate includes a fixed portion fixed to the support member, a free end displaced relative to the fixed portion when an external forced, such as a vibration forced, is applied, and a cutout located between the fixed portion and the free end.

16 Claims, 10 Drawing Sheets

(a)

(b)

(a)

(b)

(a)

(b)

(a)

(b)

Prior Art

PIEZOELECTRIC POWER GENERATING DEVICE AND MANUFACTURING METHOD THEREOF

CROSS REFERENCE TO RELATED APPLICATIONS

The present application is a continuation of International Application No. PCT/JP2011/075635, filed Nov. 7, 2011, which claims priority to Japanese Patent Application No. 2010-268771, filed Dec. 1, 2010, the entire contents of each of which are incorporated herein by reference.

FIELD OF THE INVENTION

The present invention relates to a piezoelectric power generating device which is displaced when applied with vibration or external force and generates power through the piezoelectric effect and a manufacturing method of the device, more specifically a piezoelectric power generating device using a plate-shaped piezoelectric power generating member and a manufacturing method of the device.

BACKGROUND OF THE INVENTION

In the past, a variety of piezoelectric power generating devices using the piezoelectric effect have been proposed. For example, the following Patent Document 1 discloses a piezoelectric power generating device 1001 illustrated in FIG. 13.

The piezoelectric power generating device 1001 includes a metal plate 1002 bent in a U-shape. At least one piezoelectric element 1003 is fixed to the metal plate 1002. One end of the metal plate 1002 is fixed to a fixing member 1004. The metal plate 1002 bent in a U-shape includes a first arm portion 1002a fixed to the fixing member 1004. The metal plate 1002 is bent at an end portion of the first arm portion 1002a opposite to an end portion of the first arm portion 1002a fixed to the fixing member 1004. Further, a second arm portion 1002c is connected to the first arm portion 1002a via a bent intermediate portion 1002b. The leading end of the second arm portion 1002c forms a free end.

The piezoelectric power generating device 1001 uses the metal plate 1002 bent in a U-shape as described above. When vibration or external force is applied from outside, therefore, the free end is substantially displaced, and is capable of generating a relatively large amount of power.

Further, the following Patent Document 2 discloses a piezoelectric power generating device using a piezoelectric power generating plate folded multiple times into an accordion shape. The piezoelectric power generating plate is a plate-shaped piezoelectric power generating element. Also in this case, with the use of the piezoelectric power generating plate folded into an accordion shape, the piezoelectric element is increased in area, and is capable of generating a large amount of power when vibration or external force is applied from outside.

Patent Document 1: Japanese Unexamined Patent Application Publication (Translation of PCT Application) No. 2010-517285

Patent Document 2: Japanese Unexamined Patent Application Publication (Translation of PCT Application) No. 2005-507627

In some fields using piezoelectric power generating devices, there are cases in which the vibration applied to a piezoelectric power generating device has a relatively low frequency. For example, in a piezoelectric power generating device attached to a motor vehicle or a piezoelectric power generating device which generates power by using vibration caused by human walking, the piezoelectric power generating device is required to generate power from vibration of relatively low frequency. To cause the piezoelectric power generating device to generate power from vibration of low frequency, it is necessary to reduce the resonant frequency of the piezoelectric power generating element.

In a case using a plate-shaped piezoelectric power generating element, therefore, it is necessary to increase the length of the plate-shaped piezoelectric power generating element or reduce the thickness thereof so as to reduce the resonant frequency of the piezoelectric power generating element. However, if the length of the plate-shaped piezoelectric power generating element is increased by folding the piezoelectric power generating element in a U-shape or by using a piezoelectric power generating element folded multiple times into an accordion shape, as described in Patent Document 1 or Patent Document 2, the height dimension is inevitably increased. Further, if the thickness of the plate-shaped piezoelectric power generating element is reduced, the strength of a folded portion is reduced, and plastic deformation or brittle fracture occurs. It is therefore difficult to reduce the thickness of the plate-shaped piezoelectric power generating element. Further, in the piezoelectric power generating device 1001 described in Patent Document 1, the piezoelectric element 1003 is attached only to a portion of the metal plate 1002. Therefore, the occupancy rate of the piezoelectric member in the piezoelectric power generating element is small, and thus the power generation amount is prevented from being sufficiently increased.

Further, in the piezoelectric power generating device described in Patent Document 2, the piezoelectric power generating plate having an accordion shape needs to be processed into a three-dimensional shape, and the processing is substantially complicated. Furthermore, an operation of performing a partial poling treatment on such a complicatedly shaped piezoelectric power generating plate in different directions is also complicated.

SUMMARY OF THE INVENTION

An object of the present invention is to provide a piezoelectric power generating device involving no increase in device size, easy to manufacture, and capable of extracting a large amount of power even when applied with vibration of low frequency, and a manufacturing method of the device.

A piezoelectric power generating device according to the present invention includes a piezoelectric power generating plate including a piezoelectric plate having a plurality of polarized regions different in polarization direction, and a support member configured to fix and support the piezoelectric power generating plate. The piezoelectric power generating plate includes a fixed portion fixed and supported by the support member, a free end of the piezoelectric power generating plate displaced relative to the fixed portion when applied with external force, and a cutout located between the fixed portion and the free end. The cutout is formed such that, when the external force is applied, a first piezoelectric power generating plate portion located between the cutout and an end portion on the side of the fixed portion and a second piezoelectric power generating plate portion located between the cutout and an end portion on the side of the free end are displaced in different directions.

In a specific aspect of the piezoelectric power generating device according to the present invention, the cutout has a frame shape with a portion thereof removed. The piezoelectric power generating plate includes the second piezoelectric power generating plate portion corresponding to a portion surrounded by the cutout, the fixed portion, the first piezoelectric power generating plate portion corresponding to a portion other than the second piezoelectric power generating plate portion, and a connecting portion connecting the first piezoelectric power generating plate portion and the second piezoelectric power generating plate portion. Further, the second piezoelectric power generating plate portion includes, in an end portion opposite to the connecting portion, a first free end which is displaced when applied with the external force. In this case, the piezoelectric power generating plate portion inside the cutout is easily displaced differently from the piezoelectric power generating plate portion outside the cutout.

In another specific aspect of the piezoelectric power generating device according to the present invention, the cutout having the frame shape with a portion thereof removed is provided in plurality such that a relatively outer cutout surrounds a relatively inner cutout, and an end portion of a piezoelectric power generating plate portion surrounded by a cutout located innermost in the piezoelectric plate forms a second free end. In this case, when the external force is applied, the piezoelectric power generating plate is displaced in a meandering shape, as viewed along a planar direction of the piezoelectric power generating plate. Even if vibration of low frequency is applied, therefore, it is possible to generate a larger amount of power.

In still another specific aspect of the piezoelectric power generating device according to the present invention, the cutout is provided such that the first piezoelectric power generating plate portion and the second piezoelectric power generating plate portion located outside the first piezoelectric power generating plate portion in a planar direction are connected on one end side of the cutout. An end portion of the second piezoelectric power generating plate portion located opposite to a connecting portion connecting the first piezoelectric power generating plate portion and the second piezoelectric power generating plate portion forms a free end. In this case, the first piezoelectric power generating plate portion and the second piezoelectric power generating plate portion are differently displaced via the connecting portion. Even if vibration of low frequency or weak external force is applied, therefore, it is possible to generate a larger amount of power.

In still another specific aspect of the piezoelectric power generating device according to the present invention, the support member is fixed on one end side of the piezoelectric power generating plate, and an end portion opposite to an end portion fixed with the support member forms a free end. In this case, the piezoelectric power generating plate is fixed on the one end side thereof, and the opposite end portion forms a free end. When external force is applied, therefore, it is possible to generate a large amount of power by using the entire dimension in the length direction of the piezoelectric power generating plate connecting the above-described one end and the opposite end portion.

In still another specific aspect of the piezoelectric power generating device according to the present invention, the cutout is provided in plurality between the fixed portion and the free end, and when a direction connecting the fixed portion and the free end is defined as a first direction, adjacent cutouts of the plurality of cutouts are alternately formed on opposite end edges in a second direction perpendicular to the first direction. In this case, the plurality of cutouts are provided, and thus three or more piezoelectric power generating plate portions different in displacement direction are provided between the fixed portion and the free end. Accordingly, it is possible to generate a larger amount of power.

In still another specific aspect of the piezoelectric power generating device according to the present invention, the fixed portion is located in a central region between one end and another end of the piezoelectric power generating plate. The one end and the other end of the piezoelectric power generating plate form free ends, and the cutout is provided between the fixed portion and each of the free ends. The fixed portion is thus located in the central region between the one end and the other end of the piezoelectric power generating plate. Accordingly, it is possible to stably support the piezoelectric power generating device.

In the piezoelectric power generating device according to the present invention, the piezoelectric power generating plate may be a unimorph type including a metal plate and a piezoelectric plate laminated on the metal plate, or may be a bimorph type.

A manufacturing method of a piezoelectric power generating device according to the present invention is a manufacturing method of a piezoelectric power generating device configured in accordance with the present invention, and includes a step of preparing a piezoelectric power generating plate, a step of forming a cutout in the piezoelectric power generating plate, and a step of joining a support member to the piezoelectric power generating plate.

In another specific aspect of the manufacturing method of a piezoelectric power generating device according to the present invention, the piezoelectric power generating plate is a unimorph type including a metal plate and a piezoelectric plate laminated on the metal plate. In the step of preparing the piezoelectric power generating plate, the piezoelectric plate provided with a cutout is attached to one surface of the metal plate, and a cutout according to the shape of the cutout is formed in the metal plate by a sandblasting process performed from the side of the piezoelectric plate, to thereby obtain the piezoelectric power generating plate including the cutout. In this case, it is possible to easily obtain a piezoelectric power generating plate including a cutout only by attaching a ceramic plate provided with a cutout to one surface of a metal plate and performing a flattening process, such as a sandblasting process.

In the piezoelectric power generating device according to the present invention, the cutout is formed at a position between the fixed portion and the free end of the piezoelectric power generating plate displaced relative to the fixed portion when applied with the external force. The cutout is formed such that, when the external force is applied, the first piezoelectric power generating plate portion located between the cutout and the end portion on the side of the fixed portion and the second piezoelectric power generating plate portion located between the cutout and the end portion on the side of the free end are displaced in different directions. It is therefore possible to reduce the resonant frequency of the piezoelectric power generating plate, and increase the displacement amount. Accordingly, it is possible to generate a large amount of power, even when vibration of low frequency or weak external force is applied.

In addition, it is possible to increase the power to be generated only by forming the cutout in the piezoelectric power generating plate. It is therefore possible to obtain a large amount of power without increasing the dimension along the thickness direction of the piezoelectric power generating plate.

Further, the manufacturing method of a piezoelectric power generating device according to the present invention is capable of easily manufacturing a piezoelectric power generating device according to the present invention only by forming a cutout in a piezoelectric power generating plate and thereafter joining thereto a support member.

DETAILED DESCRIPTION OF THE PREFERRED EMBODIMENTS OF THE INVENTION

With reference to the drawings, specific embodiments of the present invention will be described below to thereby reveal the present invention.

Figure 1:
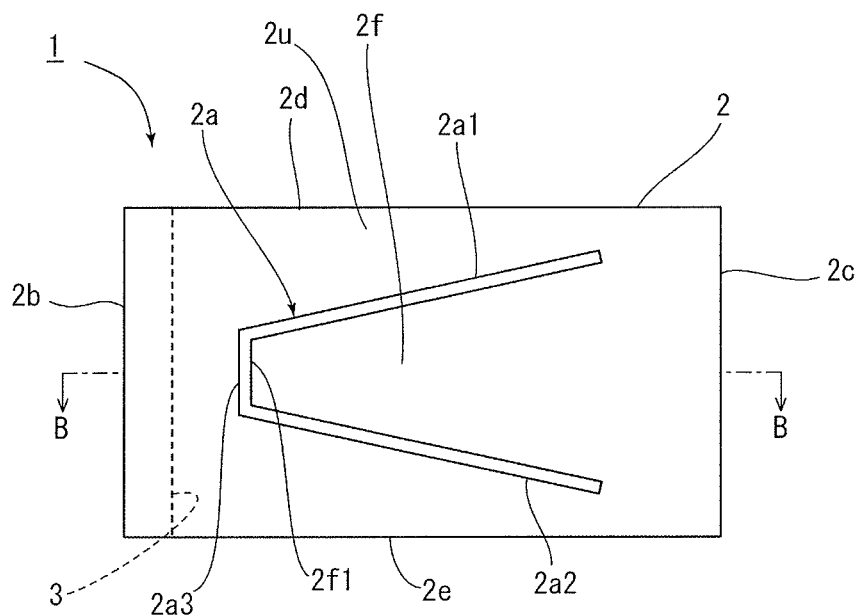
In FIG. 1, (a) and (b) are a plan view for describing a piezoelectric power generating device according to a first embodiment of the present invention, and a cross-sectional view illustrating a portion along a B-B line in (a) of FIG. 1, respectively.
Figure 1:
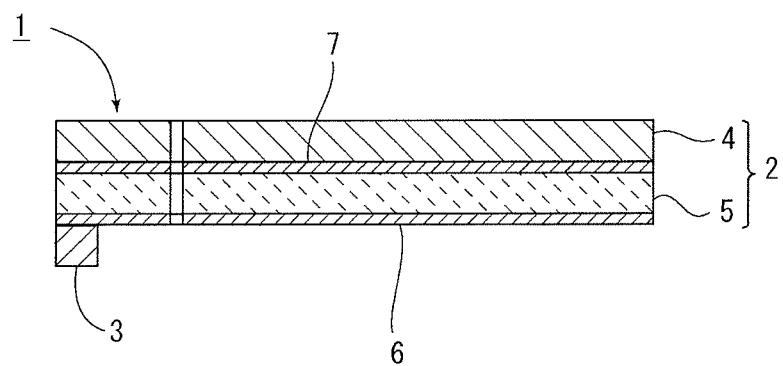

FIG. 1 illustrates a piezoelectric power generating device 1 according to a first embodiment of the present invention. In FIG. 1, (a) is a plan view of the piezoelectric power generating device 1 according to the first embodiment of the present invention, and (b) is a cross-sectional view illustrating a portion along a B-B line in (a) of FIG. 1.

The piezoelectric power generating device 1 includes a piezoelectric power generating plate 2 and a support member 3. The piezoelectric power generating plate 2 has a rectangular plate shape with a length direction, and includes mutually facing short sides 2b and 2c and mutually facing long sides 2d and 2e in a plan view. The support member 3 fixes and supports a portion on the side of the short side 2b corresponding to one end of the piezoelectric power generating plate 2. A portion of the piezoelectric power generating plate 2 fixed by the support member 3 is a fixed portion.

The support member 3 is provided to support and fix the piezoelectric power generating device 1 to an external object. In other words, the support member 3 is a member for fixing the piezoelectric power generating plate 2 to a part to which the piezoelectric power generating device 1 is attached. Such a support member 3 may be made of an appropriate material, such as metal, resin, or ceramics.

The piezoelectric power generating plate 2 includes a metal plate 4 and a piezoelectric plate 5 attached to one surface of the metal plate 4. That is, the piezoelectric power generating plate 2 is a unimorph type. The piezoelectric plate 5 is polarized in a thickness direction. In the present embodiment, the above-described support member 3 is fixed to the lower surface of the piezoelectric plate 5, and the metal plate 4 is attached to the upper surface of the piezoelectric plate 5, as illustrated in (b) of FIG. 1. With the support member 3 fixed to the lower surface of the piezoelectric plate 5, compressive stress constantly acts on the piezoelectric plate 5. The support member 3, however, may be fixed to the upper surface of the piezoelectric power generating plate 2.

The metal plate 4 is made of an appropriate metal material, such as metal like iron or aluminum, or alloy containing iron or aluminum, such as stainless steel, for example. The piezoelectric plate 5 is made of an appropriate piezoelectric material, such as PZT-based ceramics or non-lead-based piezoelectric ceramics including alkali niobate-based ceramics, such as potassium sodium niobate.

An electrode 6 is formed on the lower surface of the piezoelectric plate 5, and an electrode 7 is formed on the upper surface of the piezoelectric plate 5. The electrodes 6 and 7 are respectively formed on the entire area of the lower surface and the entire area of the upper surface of the piezoelectric plate 5 excluding a later-described cutout.

The electrodes 6 and 7 are made of an appropriate conductive material. Further, since the metal plate 4 is conductive, the electrode 7 formed on the surface of the piezoelectric plate 5 attached with the metal plate 4 may be omitted.

Figure 3:
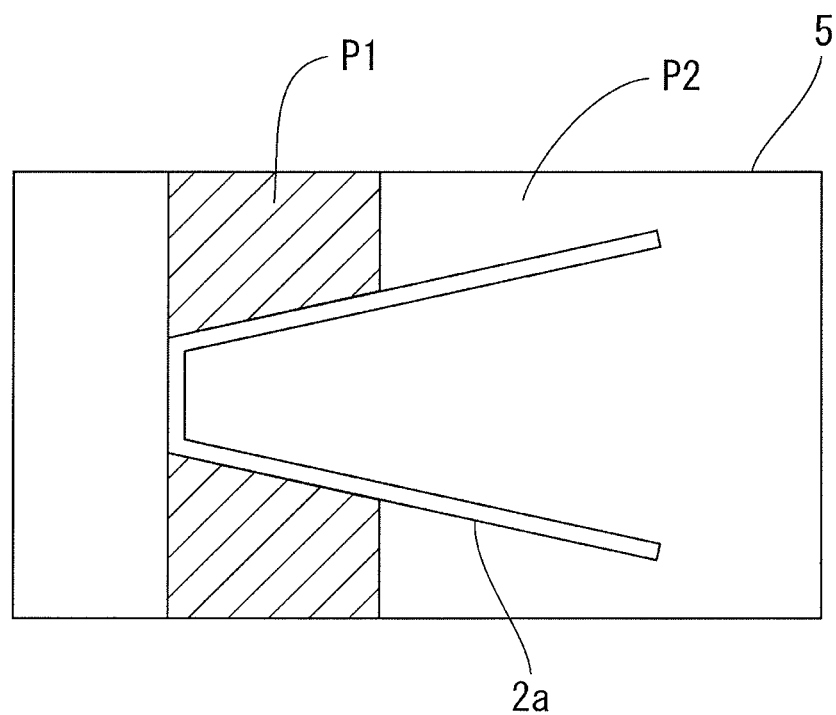
FIG. 3 is a schematic plan view for describing a plurality of polarized regions of a piezoelectric power generating plate in the piezoelectric power generating device according to the first embodiment of the present invention.

FIG. 3 illustrates a schematic plan view of the piezoelectric power generating plate 2 in the piezoelectric power generating device 1 according to the first embodiment of the present invention. In FIG. 3, the metal plate 4 is omitted. Although the piezoelectric plate 5 is subjected to a poling treatment in the thickness direction, a hatched polarized region P1 and a polarized region P2 corresponding to the remaining portion are polarized in mutually opposite directions in the thickness direction, as illustrated in FIG. 3. That is, the piezoelectric plate 5 includes the plurality of polarized regions P1 and P2 different in polarization direction. If the piezoelectric power generating plate 2 is displaced when applied with vibration or external force from outside, a first region of the piezoelectric power generating plate 2, in which compressive strain or tensile strain occurs in a surface of the piezoelectric plate 5 and compressive stress or tensile stress is generated, and a second region of the piezoelectric power generating plate 2, in which the strain direction is reversed and tensile stress or compressive stress opposite to the stress in the first region is generated, are separately formed in these plurality of polarized regions P1 and P2. With the polarized regions P1 and P2 having the opposite polarization directions, therefore, positive and negative charges generated in the polarized regions P1 and P2 by the piezoelectric effect are not offset, even if a common electrode is formed in the polarized regions P1 and P2 in the piezoelectric power generating plate 2, and it is possible to efficiently extract power based on the generated charges.

These polarized regions P1 and P2 and the state of displacement and strain of the piezoelectric power generating plate 2 will be described in more detail later.

A feature of the piezoelectric power generating device 1 of the present embodiment lies in that a cutout 2a is formed in the piezoelectric power generating plate 2. The cutout 2a has a closed frame shape with a portion thereof removed. More specifically, as illustrated in (a) of FIG. 1, the piezoelectric power generating plate 2 has a rectangular plate shape with a length direction, in which a portion of the piezoelectric power generating plate 2 on the side of the short side 2b includes a fixed portion fixed with the above-described support member 3, and the cutout 2a includes a pair of cutout components 2a1 and 2a2 extending from the side of the short side 2c toward the side of the short side 2b corresponding to the fixed portion side. The cutout components 2a1 and 2a2 are provided such that the distance therebetween is reduced from the side of the short side 2c toward the side of the short side 2b. Further, respective end portions of the cutout components 2a1 and 2a2 on the side of the short side 2b are connected to a cutout component 2a3 extending parallel to the short side 2b, thereby forming a cutout in which the cutout components 2a1, 2a2, and 2a3 are continuously connected. Meanwhile, respective end portions of the cutout components 2a1 and 2a2 on the side of the short side 2c do not form a continuous cutout. Therefore, the cutout 2a formed by the cutout components 2a1, 2a2, and 2a3 has a trapezoidal shape with the lower base thereof removed, i.e., a closed frame shape with a portion thereof removed, as illustrated in (a) of FIG. 1. This cutout 2a is formed in an inner region of the piezoelectric power generating plate 2 excluding the rectangular outer circumference thereof.

The piezoelectric power generating plate 2 includes a first piezoelectric power generating plate portion 2u and a second piezoelectric power generating plate portion 2f. The second piezoelectric power generating plate portion 2f corresponds to the portion surrounded by the cutout 2a. The first piezoelectric power generating plate portion 2u corresponds to the portion not surrounded by the cutout 2a, i.e., the portion other than the second piezoelectric power generating plate portion 2f. The cutout 2a has the above-described shape. When vibration or external force is applied from outside, therefore, the second piezoelectric power generating plate portion 2f is capable of being displaced in a different direction from that of the first piezoelectric power generating plate portion 2u. A leading end 2f1 of this second piezoelectric power generating plate portion 2f forms a first free end.

Figure 2:
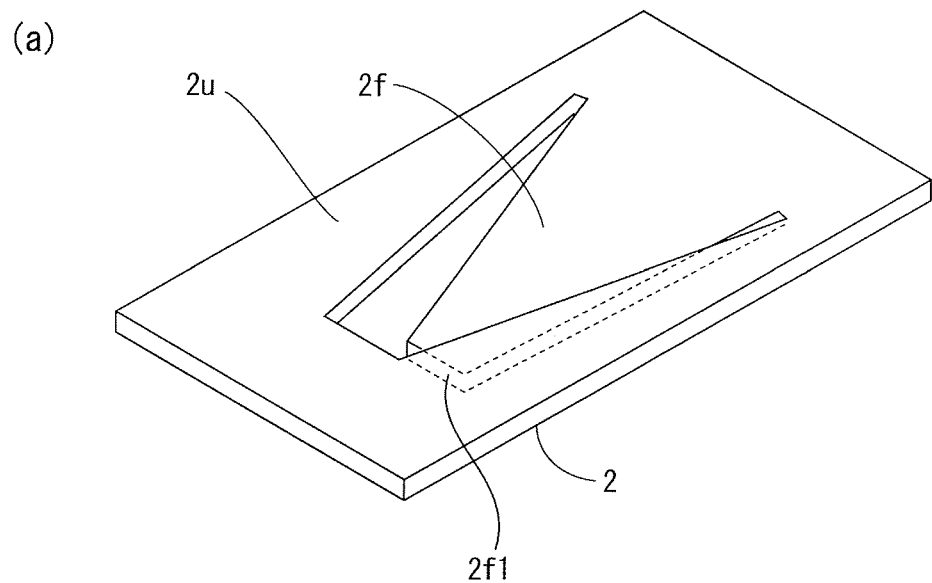
In FIG. 2, (a) and (b) are a schematic perspective view and a schematic front view, respectively, for describing a displacement state of the piezoelectric power generating device according to the first embodiment of the present invention.
Figure 2:
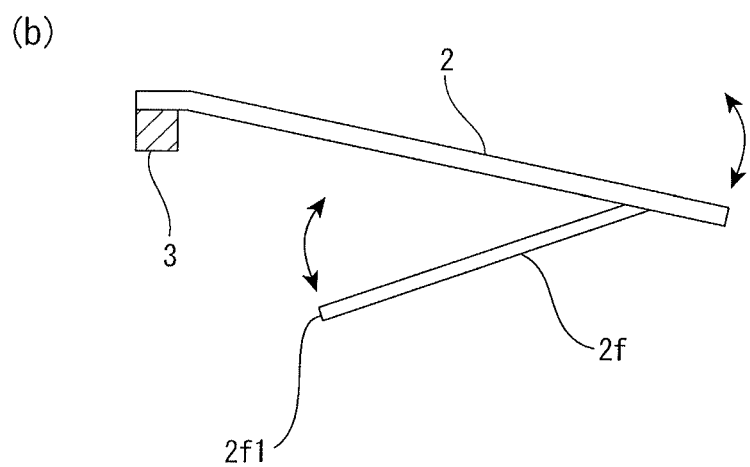

In FIG. 2, (a) is a schematic perspective view for describing a displacement state of the piezoelectric power generating device 1 according to the first embodiment of the present invention, and (b) is a schematic front view thereof. That is, if the piezoelectric power generating plate 2 is applied with vibration or external force from outside, e.g., if the piezoelectric power generating plate 2 is applied with external force including a component directed from the upper side of the piezoelectric power generating plate 2 toward the lower side thereof, the piezoelectric power generating plate 2 is displaced, as illustrated in (a) and (b) of FIG. 2. In this case, relative to the fixed portion supported by the support member 3, the first piezoelectric power generating plate portion 2u corresponding to the portion outside the cutout 2a of the piezoelectric power generating plate 2 is displaced in a bending mode, with the fixed portion acting as a fulcrum. Further, the second piezoelectric power generating plate portion 2f corresponding to the portion surrounded by the cutout 2a is displaced in a different direction from that of the first piezoelectric power generating plate portion 2u in the bending mode, with a connecting portion connecting the second piezoelectric power generating plate portion 2f and the first piezoelectric power generating plate portion 2u acting as a fulcrum. Accordingly, the leading end 2f1 forming the first free end is displaced as indicated by an arrow in (b) of FIG. 2.

In the rectangular piezoelectric power generating plate 2, with the cutout 2a provided as described above, the second piezoelectric power generating plate portion 2f corresponding to the portion surrounded by the cutout 2a and the first piezoelectric power generating plate portion 2u corresponding to the remaining portion are displaced in different directions to have respective displacement fulcrums in the bending mode at mutually different positions within the continuous flat plate of the piezoelectric power generating plate 2. In such displacement, a region having compressive strain and a region having tensile strain are separately generated in the piezoelectric power generating plate 2. The regions reversed to each other in strain direction to have compressive strain or tensile strain are identifiable by analysis according to the finite element method or the like.

The polarized regions P1 and P2 in FIG. 3 thus correspond to the region in which, when the piezoelectric power generating plate 2 provided with the cutout 2a is displaced, the strain direction of the piezoelectric power generating plate 2 corresponds to tensile strain, and the region in which, when the piezoelectric power generating plate 2 provided with the cutout 2a is displaced, the strain direction of the piezoelectric power generating plate 2 corresponds to compressive strain, respectively. As previously described, therefore, the polarized regions P1 and P2 have mutually opposite polarization directions of the piezoelectric plate 5 in the thickness direction. Even with a simple planar structure in which a common electrode is formed in the polarized regions P1 and P2, therefore, the charges generated in the polarized regions P1 and P2 are not offset. Accordingly, even if vibration of low frequency or weak external force is applied from outside, and even with a simple structure, it is possible to reliably obtain a large amount of power without an increase in height dimension perpendicular to a main surface of the piezoelectric power generating plate 2.

Particularly, as compared with a piezoelectric power generating plate having the same outer dimension as that of the piezoelectric plate 5 but not including a cutout, the above-described piezoelectric power generating plate 2 in the present embodiment is formed with the cutout 2a, and thus is capable of extracting a large amount of power. This is because, when vibration or external force is applied from outside, the second piezoelectric power generating plate portion 2f corresponding to the portion surrounded by the cutout 2a and the first piezoelectric power generating plate portion 2u corresponding to the remaining portion are displaced in different directions, as described above. That is, it is because, even if vibration of low frequency or weak external force is applied from outside, the piezoelectric power generating plate 2 as a whole is capable of obtaining a larger displacement amount, and therefore is capable of increasing the total amount of charges to be generated.

Accordingly, the piezoelectric power generating device 1 of the present embodiment is capable of obtaining a large power generation amount without increasing the dimension of the piezoelectric power generating plate 2.

In addition, as described later, with a change in shape of the cutout 2a, it is also possible to easily control the resonant frequency of the piezoelectric power generating plate 2, when the piezoelectric power generating plate 2 is applied with vibration or external force.

Further, since the above-described piezoelectric power generating plate 2 only requires the cutout 2a to be formed therein, the manufacturing process is simple. Furthermore, since the piezoelectric plate 5 having a flat plate shape only requires the polarized regions P1 and P2 to be formed therein, the poling treatment is also simple.

Figure 4:
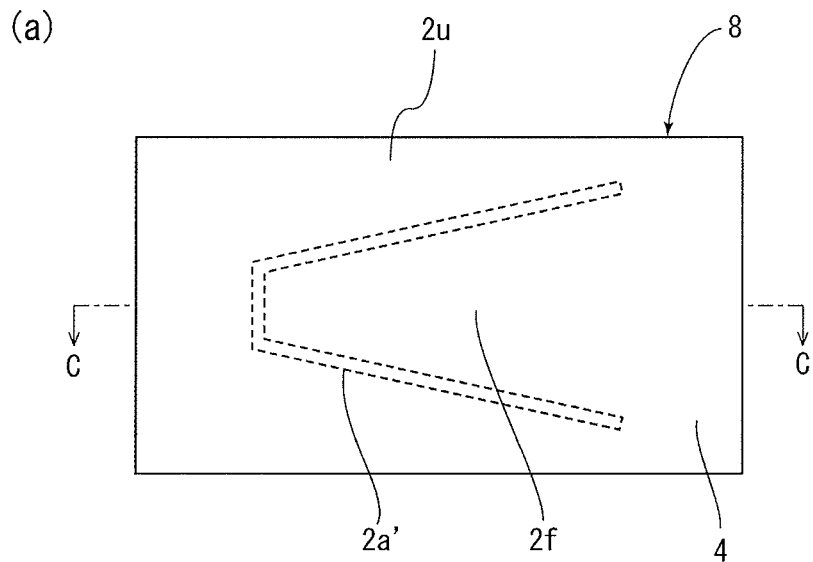
In FIG. 4, (a) and (b) are diagrams for describing a method of manufacturing the piezoelectric power generating device according to the first embodiment of the present invention, (a) of FIG. 4 being a plan view illustrating a laminate in which a piezoelectric plate provided with a cutout is attached to a metal plate, and (b) of FIG. 4 being a front cross-sectional view along a C-C line in (a) of FIG. 4.
Figure 4:
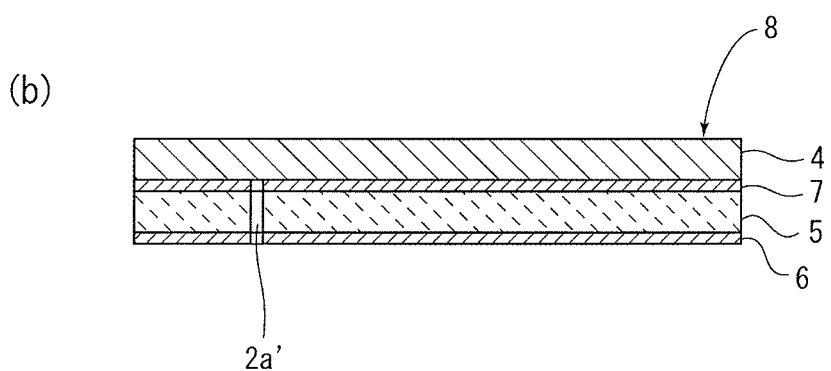

Description will be given of an example of a manufacturing method of the above-described piezoelectric power generating device 1. In FIG. 4, (a) and (b) are diagrams for describing a method of manufacturing the piezoelectric power generating device 1 according to the first embodiment of the present invention. In FIG. 4, (a) is a plan view illustrating a laminate 8 in which the piezoelectric plate 5 provided with a cutout 2a' is attached to the metal plate 4, and (b) is a front cross-sectional view along a C-C line in (a) of FIG. 4. The piezoelectric plate 5 is first prepared which includes the cutout 2a' forming the cutout 2a. This process may be performed by obtaining a rectangular piezoelectric ceramic plate and thereafter forming the cutout 2a' by laser processing, mechanical processing, or the like. Alternatively, the above-described piezoelectric plate 5 may be obtained by molding an unbaked piezoelectric plate to have the cutout 2a' and thereafter baking the piezoelectric plate.

Then, the piezoelectric plate 5 is polarized. After the piezoelectric plate 5 including the cutout 2a' is first prepared, a portion of the upper surface of the piezoelectric plate 5 corresponding to the polarized region P1 and a portion of the upper surface of the piezoelectric plate 5 corresponding to the polarized region P2 are formed with respective polarizing electrodes such that the polarizing electrodes are not in contact with each other. The entire lower surface of the piezoelectric plate 5 is formed with an electrode. Then, a poling treatment may be performed by applying a voltage between the electrodes on the upper and lower surfaces such that the direction of the applied voltage is opposite between the polarized region P1 and the polarized region P2.

After the above-described poling treatment, the polarizing electrodes may be removed from the upper surface of the piezoelectric plate 5, and thereafter the electrode 7 may be formed on the entire surface. Alternatively, the electrode 7 may be formed by forming a conductive film to cover the entire upper surface of the piezoelectric plate 5, with the polarizing electrodes left unremoved. The polarizing electrode formed on the entire lower surface of the piezoelectric plate 5 may be used as the electrode 6.

The electrodes 7 and 6 are thus formed on the upper and lower surfaces of the piezoelectric plate 5. Thereafter, the piezoelectric plate 5 is attached to the metal plate 4 not including a cutout, to thereby obtain the laminate 8 illustrated in (a) and (b) of FIG. 4. After the laminate 8 is obtained, a sandblasting process is performed from the side of the cutout 2a' of the piezoelectric plate 5. Thereby, a cutout is formed in the metal plate 4 under the cutout 2a' of the piezoelectric plate 5. The piezoelectric power generating plate 2 illustrated in FIG. 1 is obtainable in such a manner. The piezoelectric power generating device 1 is obtainable by fixing the support member 3 to the piezoelectric power generating plate 2.

The process of forming a cutout in the metal plate 4 is not limited to the sandblasting method, and may employ another grinding method, a processing method using a laser, or the like.

According to the above-described manufacturing method, it is possible to easily obtain the shape of the piezoelectric power generating plate 2 only by performing a process leaving just a two-dimensional processing path, such as the sandblasting process, after the laminate 8 is obtained.

To attach the piezoelectric plate 5 to the metal plate 4, an appropriate adhesive, such as a conductive adhesive or an insulating adhesive, may be used. Also in a case in which the electrode 7 is omitted, the piezoelectric plate 5 may be attached to the metal plate 4 by a conductive adhesive or an insulating adhesive. Even with the use of an insulating adhesive, if the insulating adhesive is substantially thin, the piezoelectric plate 5 and the metal plate 4 having surfaces with fine irregularities locally come into contact with each other to be electrically connected to each other. Alternatively, with the piezoelectric plate 5, the metal plate 4, and the insulating adhesive functioning as a capacitor, it is possible to transmit alternating-current power.

Figure 5:
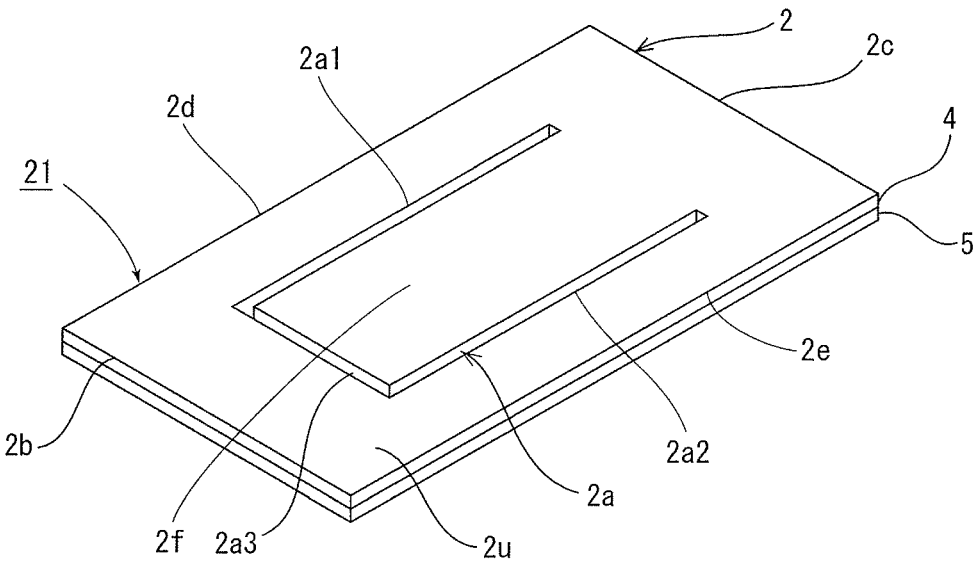
FIG. 5 is a schematic perspective view of a piezoelectric power generating device according to a second embodiment of the present invention.

FIG. 5 is a schematic perspective view illustrating a piezoelectric power generating device 21 according to a second embodiment of the present invention. In the piezoelectric power generating device 21 of the second embodiment, the piezoelectric power generating plate 2 is similar to that of the first embodiment, except for the shape of the cutout. Therefore, identical portions are assigned with identical reference numerals, to thereby incorporate the description of the first embodiment. In the first embodiment, the cutout 2a has the cutout components 2a1 and 2a2 provided such that the distance therebetween is reduced from the side of the short side 2c toward the side of the short side 2b. Meanwhile, in the piezoelectric power generating device 21 illustrated in FIG. 5, the cutout components 2a1 and 2a2 are provided to extend parallel to the long sides 2d an 2e. Therefore, the second piezoelectric power generating plate portion 2f corresponding to the portion surrounded by the cutout 2a has a rectangular shape. The shape of the second piezoelectric power generating plate portion 2f surrounded by the cutout 2a may thus be changed as appropriate. With a change in planar shape of the second piezoelectric power generating plate portion 2f corresponding to the portion surrounded by the cutout 2a, it is possible to easily adjust the resonant frequency of the piezoelectric power generating plate 2 when applied with vibration or external force from outside. In FIG. 5, the support member 3 and the electrodes 6 and 7 are omitted.

Figure 6:
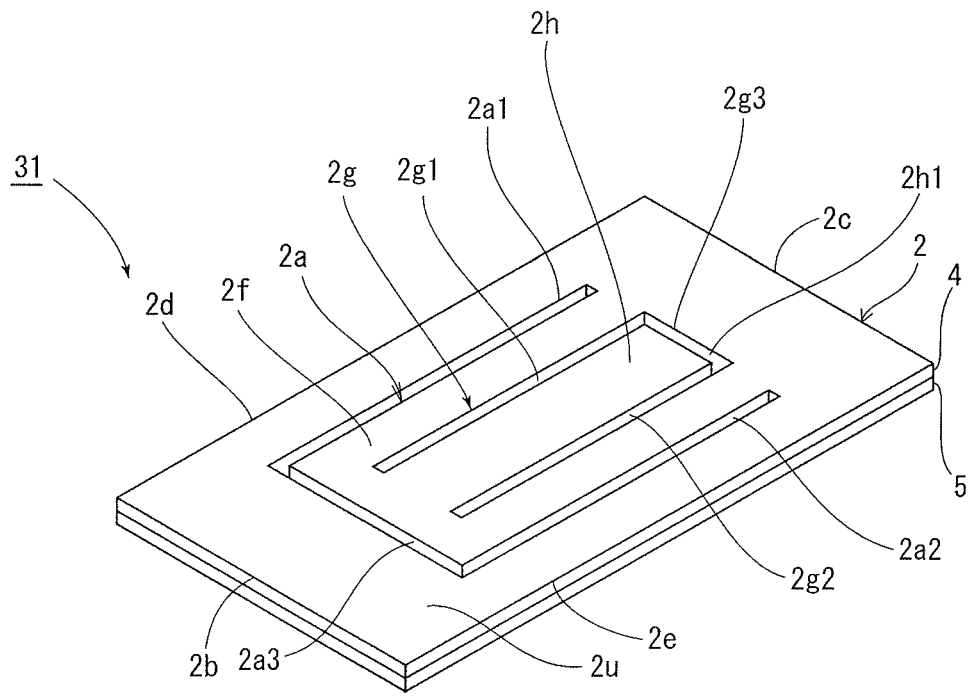
FIG. 6 is a schematic perspective view of a piezoelectric power generating device according to a third embodiment of the present invention.

FIG. 6 is a schematic perspective view illustrating a piezoelectric power generating device 31 according to a third embodiment of the present invention. In the piezoelectric power generating device 31 of the third embodiment, the piezoelectric power generating plate 2 is similar to that of the first embodiment, except for the shape of the cutout. Therefore, identical portions are assigned with identical reference numerals, to thereby incorporate the description of the first embodiment. In the piezoelectric power generating device 31, a cutout 2g is further formed in addition to the cutout 2a illustrated in FIG. 5. The cutout 2g has the shape of the cutout 2a reversed in the portion surrounded by the cutout 2a. That is, the plurality of cutouts 2a and 2g are provided such that the cutout 2a located relatively outside surrounds the cutout 2g located relatively inside. The cutout 2g includes a pair of cutout components 2g1 and 2g2 extending parallel to the long sides 2d and 2e from the side of the short side 2b toward the side of the short side 2c, and respective end portions of the cutout components 2g1 and 2g2 on the side of the short side $2c$ are connected by a cutout component $2g3$ extending parallel to the short side $2c$. In FIG. 6, the support member 3 and the electrodes 6 and 7 are omitted.

Since the cutout $2g$ is formed in addition to the cutout $2a$, a leading end $2h1$ of a third piezoelectric power generating plate portion $2h$ corresponding to the portion surrounded by the cutout $2g$ forms a second free end.

Since the cutouts $2a$ and $2g$ are formed, in the piezoelectric power generating device 31, the third piezoelectric power generating plate portion $2h$ corresponding to the portion surrounded by the cutout $2g$ is further displaced in a different direction from that of the second piezoelectric power generating plate portion $2f$ corresponding to the portion surrounded by the cutout $2a$, when vibration or external force is applied from outside. In this case, in a front view of the piezoelectric power generating plate 2, i.e., when the piezoelectric power generating plate 2 is viewed from the side of the long side $2e$, the piezoelectric power generating plate 2 has the second piezoelectric power generating plate portion $2f$ displaced at a different angle to a peripheral portion including the fixed portion, and has the third piezoelectric power generating plate portion $2h$ further displaced in a different direction from that of the second piezoelectric power generating plate portion $2f$. That is, the piezoelectric power generating plate 2 is displaced in a substantially meandering shape. Since each of the second piezoelectric power generating plate portion $2f$ and the third piezoelectric power generating plate portion $2h$ is thus displaced in a different direction from that of a portion including the fixed portion and the first piezoelectric power generating plate portion $2u$, it is possible to extract a larger amount of power.

In the present embodiment, the third piezoelectric power generating plate portion $2h$ corresponding to the portion surrounded by the above-described cutout $2g$ is provided inside the second piezoelectric power generating plate portion $2f$ corresponding to the portion surrounded by the above-described cutout $2a$. A portion connecting this second piezoelectric power generating plate portion $2f$ and the third piezoelectric power generating plate portion $2h$ corresponds to the aforementioned first free end. Further, the third piezoelectric power generating plate portion $2h$ extends from the first free end, and the leading end $2h1$ of the third piezoelectric power generating plate portion $2h$ corresponds to the second free end of the present invention.

Also in the present embodiment, therefore, the first piezoelectric power generating plate portion $2u$ located on the fixed portion side and the cutouts $2a$ and $2g$ located between the fixed portion and the leading end $2h1$ forming the second free end of the present invention are present. The cutouts $2a$ and $2g$ are formed such that the first piezoelectric power generating plate portion $2u$, the second piezoelectric power generating plate portion $2f$, and the third piezoelectric power generating plate portion $2h$ are displaced in different directions.

Although the first and second cutouts $2a$ and $2g$ are provided in FIG. 6, a larger number of cutouts may be provided.

Figure 7:
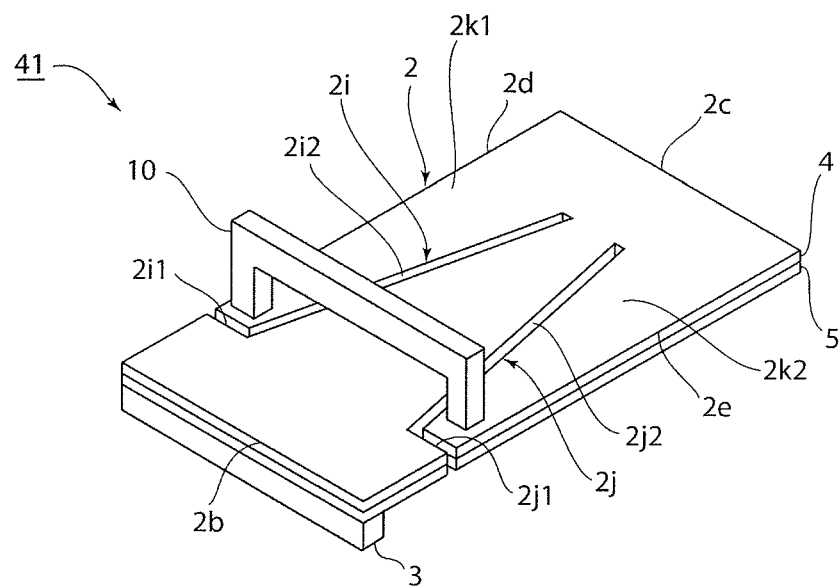
FIG. 7 is a schematic perspective view of a piezoelectric power generating device according to a fourth embodiment of the present invention.

FIG. 7 is a schematic perspective view of a piezoelectric power generating device 41 according to a fourth embodiment of the present invention. In the piezoelectric power generating device 41 of the fourth embodiment, the piezoelectric power generating plate 2 is similar to that of the first embodiment, except for the shape of the cutout. Therefore, identical portions are assigned with identical reference numerals, to thereby incorporate the description of the first embodiment.

In the piezoelectric power generating device 41, cutouts $2i$ and $2j$ are formed in the piezoelectric power generating plate 2. The cutouts $2i$ and $2j$ include cutout components $2i1$ and $2i2$ and cutout components $2j1$ and $2j2$, respectively. The cutout component $2i1$ extends from the long side $2d$ toward the long side $2e$ of the piezoelectric power generating plate 2, and a leading end portion thereof is connected to the cutout component $2i2$. The cutout component $2i2$ extends from the side of the short side $2b$ toward the side of the short side $2c$ of the piezoelectric power generating plate 2. The cutout component $2j1$ extends from the long side $2e$ toward the long side $2d$ of the piezoelectric power generating plate 2, and a leading end portion thereof is connected to the cutout component $2j2$. The cutout component $2j2$ extends from the side of the short side $2b$ toward the side of the short side $2c$ of the piezoelectric power generating plate 2.

The cutout components $2i2$ and $2j2$ extend from respective end portions thereof connected to the cutout components $2i1$ and $2j1$ toward the short side $2c$, and are provided such that the distance therebetween is reduced toward the short side $2c$. Further, the cutout components $2i2$ and $2j2$ are provided not to reach the short side $2c$. A region on the side of the long side $2e$ and a region on the side of the long side $2d$ both on the side of the short side $2b$ of the piezoelectric power generating plate 2 are joined with a common weight 10.

In the piezoelectric power generating device 41 of the present embodiment, the cutouts $2i$ and $2j$ are formed as described above. When vibration or external force is applied from outside, therefore, piezoelectric power generating plate portions $2k1$ and $2k2$ outside the cutouts $2i$ and $2j$ are displaced in a different direction from that of the fixed portion fixed with the support member 3 and corresponding to the portion surrounded by the cutouts $2i$ and $2j$. Herein, the respective leading ends of the piezoelectric power generating plate portions $2k1$ and $2k2$ form free ends. That is, respective portions of the piezoelectric power generating plate portions $2k1$ and $2k2$ reaching the cutout components $2i1$ and $2j1$ form free ends.

Also in the present embodiment, therefore, the cutouts $2i$ and $2j$ are formed between the fixed portion and the free ends.

Further, with the above-described cutouts $2i$ and $2j$ formed also in the present embodiment, a piezoelectric power generating plate portion on the fixed portion side from the cutouts $2i$ and $2j$ and a piezoelectric power generating plate portion on the free end side from the cutouts $2i$ and $2j$ are displaced in different directions between the fixed end and the free ends. It is therefore possible to reduce the resonant frequency of the piezoelectric power generating device 41, and obtain a large displacement amount. Accordingly, it is possible to obtain a large power generation amount, when vibration or external force is applied from outside.

Moreover, the free ends corresponding to the respective leading ends of the piezoelectric power generating plate portions $2k1$ and $2k2$ outside the cutouts $2i$ and $2j$ are both joined with the weight 10. When vibration or external force is applied from outside, therefore, torsional deformation and the phase difference in flexion deformity between the free ends are suppressed, and it is possible to suppress a reduction in power generation amount of the piezoelectric power generating device 41.

Figure 8:
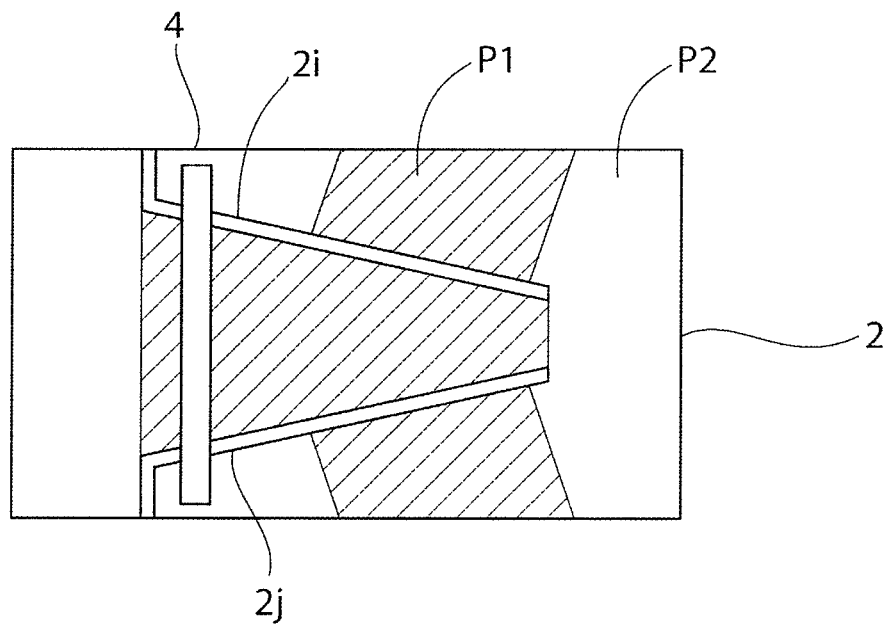
FIG. 8 is a schematic plan view for describing a plurality of polarized regions of a piezoelectric power generating plate in the piezoelectric power generating device according to the fourth embodiment of the present invention.

The above-described piezoelectric power generating device 41 includes a portion in which stress is reversed when vibration or external force is applied from outside. Therefore, the portion in which stress is reversed and the remaining portion may be subjected to a poling treatment in opposite directions in the thickness direction. FIG. 8 illustrates a schematic plan view of the piezoelectric power generating plate 2 in the piezoelectric power generating device 41. The hatched polarized region P1 corresponds to a portion in which, when vibration or eternal force is applied from outside, strain is generated in the opposite direction to that of strain generated in the polarized region P2 corresponding to the remaining portion. The piezoelectric plate 5 is therefore subjected to the poling treatment in the thickness direction similarly as in the first embodiment, and the polarized region P1 and the remaining polarized region P2 may be subjected to the poling treatment in opposite directions in the thickness direction.

Figure 9:
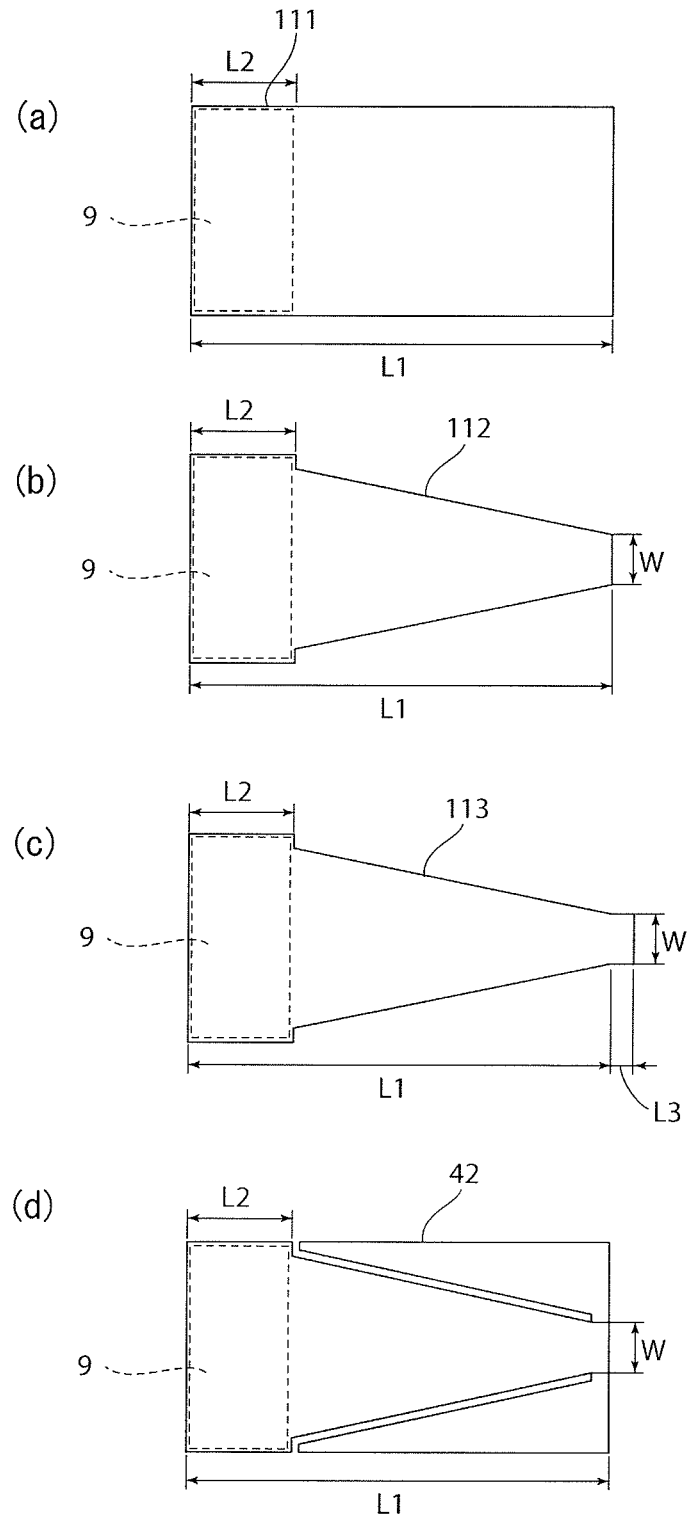
In FIG. 9, (a) to (d) are schematic plan views for describing piezoelectric power generating devices in a comparative example and first to third experimental examples.

As described previously, it is possible in the present invention to easily change the shapes of a plurality of differently displaced portions of the piezoelectric power generating plate 2 by devising the shape of the above-described cutout. Accordingly, it is possible to control the resonant frequency of the piezoelectric power generating plate 2. This will be described with reference to (a) to (d) of FIG. 9. A plurality of piezoelectric power generating devices were prepared each having a piezoelectric power generating plate including a metal plate having a thickness of 0.1 mm and a piezoelectric plate joined thereto. In FIG. 9, (a) is a schematic plan view of a piezoelectric power generating device in a comparative example including a piezoelectric power generating plate 111. The piezoelectric power generating plate 111 is a rectangular piezoelectric power generating plate including a rectangular metal plate having a length (L1) of 30 mm, a width of 20 mm, and a thickness of 0.1 mm joined to a piezoelectric plate having the same outer dimension and the same thickness. As illustrated in (a) of FIG. 9, when the piezoelectric power generating plate 111 was fixed in a fixed portion 9 corresponding to a region of the piezoelectric power generating plate 111 surrounded by a broken line, specifically a region of the piezoelectric power generating plate 111 extending by 5.0 mm from one end thereof in the length direction, and vibration or external force was applied from outside to cause cantilever vibration, the resonant frequency of the piezoelectric power generating plate 111 in the piezoelectric power generating device of the comparative example was 220.1 Hz. Herein, when the length from the one end of the piezoelectric power generating plate 111 in the length direction to an end portion of the fixed portion 9 is represented as L2, L2 is 5.0 mm in the comparative example.

In FIG. 9, (b) is a schematic plan view of a piezoelectric power generating device in a first experimental example including a piezoelectric power generating plate 112. In FIG. 9, (c) is a schematic plan view of a piezoelectric power generating device in a second experimental example including a piezoelectric power generating plate 113. The piezoelectric power generating plates 112 and 113 are each a piezoelectric power generating plate including a metal plate having a substantially trapezoidal shape in a plan view and a thickness of 0.1 mm joined with a piezoelectric plate having the same outer dimension and the same thickness. In the piezoelectric power generating plate 112, L1 is 30 mm, and L2 is 5.0 mm, similarly as in the piezoelectric power generating plate 111. In the piezoelectric power generating plate 113, L2 is 5.0 mm, similarly as in the piezoelectric power generating plates 111 and 112. The piezoelectric power generating plate 113, however, includes a portion extending from an end portion of the piezoelectric power generating plate 112 by a length L3 of 6.0 mm. That is, the length of the piezoelectric power generating plate 113 is L1+L3, which is 36.0 mm. In each of the piezoelectric power generating plates 112 and 113, a length (W) of the other end in the length direction opposite to the one end in the length direction of the piezoelectric power generating plate is 4.0 mm. As illustrated in (b) and (c) of FIG. 9, when the piezoelectric power generating plates 112 and 113 were fixed in the fixed portion 9 corresponding to a region of the piezoelectric power generating plates 112 and 113 surrounded by a broken line, and vibration or external force was applied from outside to cause cantilever vibration, the resonant frequency of the piezoelectric power generating plate 112 in the piezoelectric power generating device of the first experimental example was 312.1 Hz, and the resonant frequency of the piezoelectric power generating plate 113 in the piezoelectric power generating device of the second experimental example was 224.7 Hz.

In FIG. 9, (d) is a schematic plan view of a piezoelectric power generating device in a third experimental example including a piezoelectric power generating plate 42. The piezoelectric power generating plate 42 has a similar shape to that of the piezoelectric power generating device 41 of the above-described fourth embodiment, and has L1 of 30 mm, L2 of 5.0 mm, and W of 4.0 mm. As illustrated in (d) of FIG. 9, when the piezoelectric power generating plate 42 was fixed in the fixed portion 9 corresponding to a region of the piezoelectric power generating plate 42 surrounded by a broken line, and vibration or external force was applied from outside to cause cantilever vibration, the resonant frequency of the piezoelectric power generating plate 42 in the piezoelectric power generating device of the third experimental example was 184.1 Hz. That is, it is understood that the piezoelectric power generating device 41 of the above-described embodiment is capable of substantially reducing the resonant frequency of the piezoelectric power generating plate 42, as compared with the rectangular piezoelectric power generating plate 111 illustrated in (a) of FIG. 9 having the same outer dimension. It is also understood from comparison of (a) to (d) of FIG. 9 that, with a change in shape of the cutouts and the portion surrounded by the cutouts, it is possible to easily adjust the resonant frequency of the piezoelectric power generating plate to a low frequency, while suppressing a reduction in area of the piezoelectric power generating plate. Accordingly, it is understood that it is possible to form a piezoelectric power generating device to obtain a larger power generation amount by changing the shape of the portion surrounded by the cutouts or the shape of the cutouts in accordance with the purpose, i.e., in accordance with the frequency of the vibration applied from outside.

Figure 10:
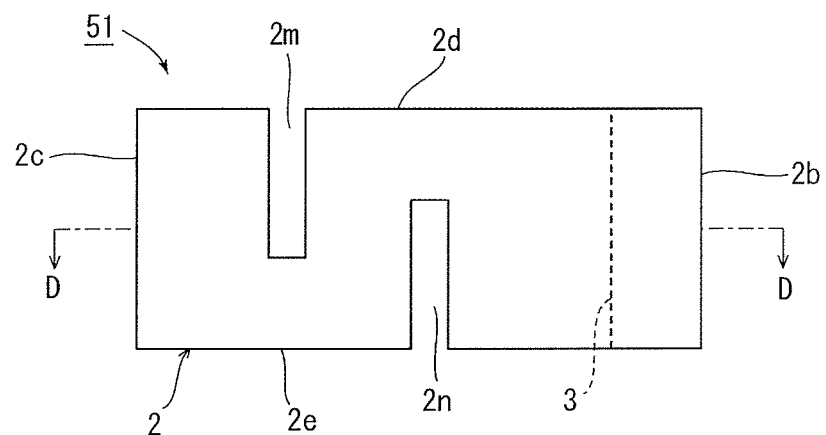
In FIG. 10, (a) and (b) are a plan view for describing a piezoelectric power generating device according to a fifth embodiment of the present invention, and a cross-sectional view illustrating a portion along a D-D line in (a) of FIG. 10, respectively.
Figure 10:
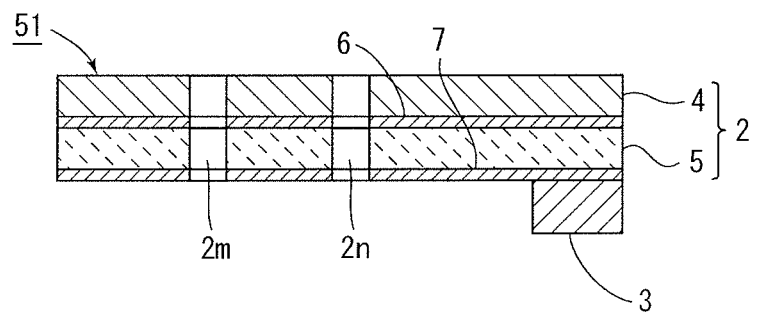

FIG. 10 illustrates a piezoelectric power generating device 51 according to a fifth embodiment of the present invention. In FIG. 10, (a) is a plan view of the piezoelectric power generating device 51 according to the fifth embodiment of the present invention, and (b) is a cross-sectional view illustrating a portion along a D-D line in (a) of FIG. 10.

In the piezoelectric power generating device 51 of the fifth embodiment, the rectangular piezoelectric power generating plate 2 is fixed with the support member 3 at an end portion thereof on the side of short side 2b, i.e., on one end side thereof. That is, the fixed portion is located on the side of the short side 2b. Further, the piezoelectric power generating plate 2 is supported by the support member 3 in a cantilever fashion. Accordingly, an end portion on the side of the short side 2c, i.e., on the side opposite to the fixed portion forms a free end.

In the piezoelectric power generating device 51 of the present embodiment, a plurality of cutouts 2m and 2n are formed between the fixed portion and the free end described above. The cutout 2m extends from one long side 2d toward the other long side 2e. The cutout 2n extends from the long side 2e toward the other long side 2d. That is, the plurality of cutouts 2m and 2n extend in a direction perpendicular to a direction connecting the fixed portion and the free end, and are alternately provided on opposite end edges of the piezoelectric power generating plate in the direction connecting the fixed portion and the free end.

In the present embodiment, when vibration or external force is applied from outside, a first piezoelectric power generating plate portion between the cutout 2n and the fixed portion, a second piezoelectric power generating plate portion sandwiched between the cutouts 2m and 2n, and a third piezoelectric power generating plate portion between the cutout 2m and the free end are displaced in different directions. Similarly as in the first embodiment, therefore, the piezoelectric plate 5 may be subjected to the poling treatment in different polarization directions in the thickness direction in accordance with the region in which stress is reversed when the displacement occurs in these different directions. Accordingly, it is possible to extract power from charges generated when the piezoelectric plate 5 is displaced.

Also in the present embodiment, the cutouts 2m and 2n are formed. It is therefore possible to reduce the resonant frequency of the piezoelectric power generating plate, and generate a large amount of charges even when vibration of low frequency or weak external force is applied from outside, to thereby extract a large amount of power. As described above, the cutout of the present invention may be provided between the fixed portion and the free end, and may be formed into an appropriate shape in which the piezoelectric power generating plate portion on the fixed portion side from the cutout and the piezoelectric power generating plate portion on the free end side from the cutout are differently displaced.

Figure 11:
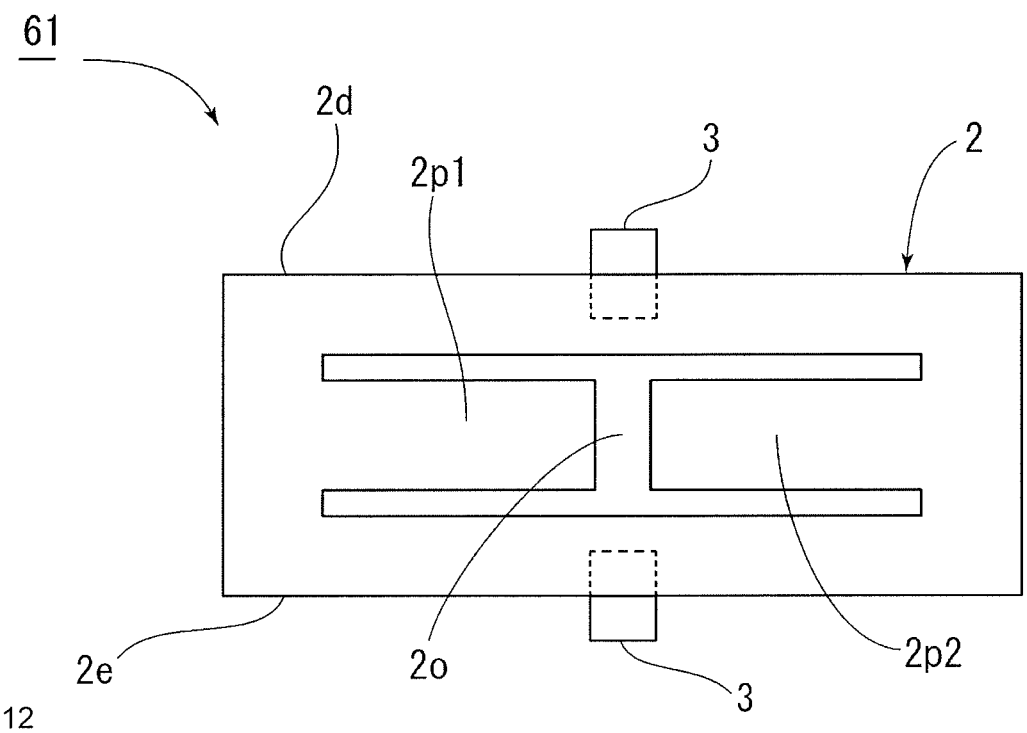
FIG. 11 is a plan view of a piezoelectric power generating device according to a sixth embodiment of the present invention.

FIG. 11 is a plan view of a piezoelectric power generating device 61 according to a sixth embodiment of the present invention. The piezoelectric power generating device 61 of the present embodiment corresponds to a structure integrating two piezoelectric power generating devices 21 of the second embodiment. That is, the piezoelectric power generating plate 2 is formed with a cutout 2o. The cutout 2o has a structure in which the cutouts 2a of the second embodiment are integrated to share the cutout component 2a3. In the piezoelectric power generating device 61, therefore, a pair of piezoelectric power generating plate portions 2p1 and 2p2 surrounded by the cutout 2o are provided, and the respective leading ends of these piezoelectric power generating plate portions 2p1 and 2p2 form free ends. Also in this case, when vibration or external force is applied from outside, the piezoelectric power generating plate portions 2p1 and 2p2 surrounded by the cutout 2o and the remaining piezoelectric power generating plate portion are displaced in different directions. Accordingly, it is possible to extract a large amount of power similarly as in the second embodiment.

Further, in the present embodiment, the support members 3 are fixed to respective central portions in the length direction of the long sides 2d and 2e of the above-described piezoelectric power generating plate 2. That is, the fixed portion is located at the center in the length direction of the piezoelectric power generating plate 2. Thus, the fixed portion of the piezoelectric power generating device of the present invention is not limited to one end side of the piezoelectric power generating plate.

Figure 12:
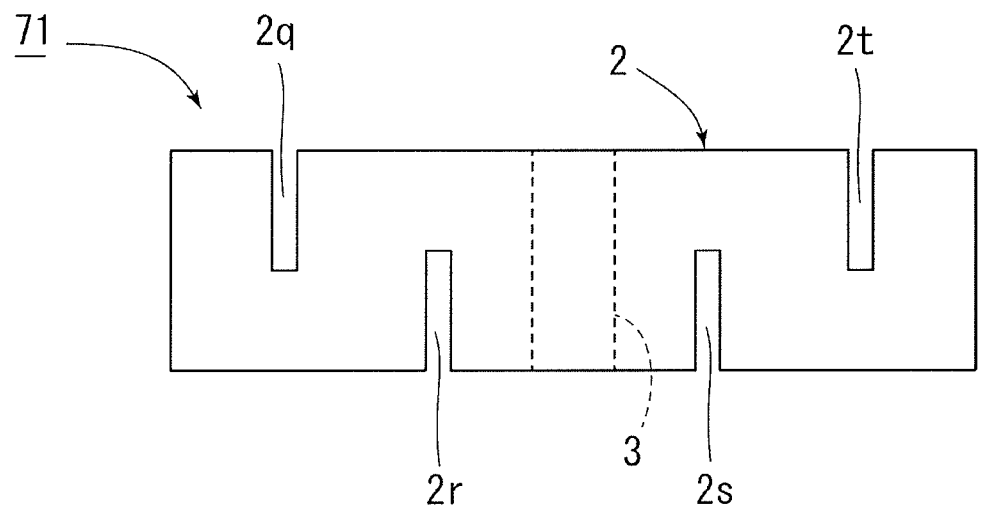
FIG. 12 is a plan view of a piezoelectric power generating device according to a seventh embodiment of the present invention.
Figure 13:
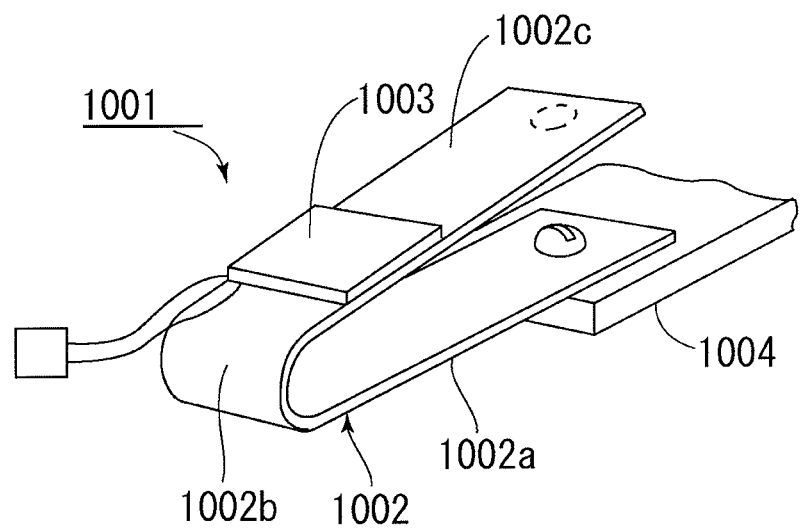
FIG. 13 is a perspective view for describing an example of a conventional piezoelectric power generating device.

FIG. 12 is a plan view of a piezoelectric power generating device 71 according to a seventh embodiment of the present invention. In the piezoelectric power generating device 71 of the present embodiment, the piezoelectric power generating plate 2 is formed with a plurality of cutouts 2q, 2r, 2s, and 2t similarly as in the fifth embodiment. Herein, the support member 3 is fixed at the center in the length direction of the rectangular piezoelectric power generating plate 2. Therefore, a piezoelectric power generating plate portion between the support member 3 and an end portion on one side of the piezoelectric power generating plate 2 and a piezoelectric power generating plate portion between the support member 3 and an end portion on the other side of the piezoelectric power generating plate 2 are displaced with the fixed portion acting as a fulcrum. Each of the piezoelectric power generating plate portion on the one side and the piezoelectric power generating plate portion on the other side functions similarly to the piezoelectric power generating device 51 of the fifth embodiment. Accordingly, even in a case in which the piezoelectric power generating device 71 is supported with the fixed portion disposed at the center in the length direction of the piezoelectric power generating plate 2, it is possible to extract a large amount of power similarly as in the fifth embodiment.

Further, the fixed portion is provided at the center of the piezoelectric power generating plate, as in the sixth and seventh embodiments. Thus, the position of the fixed portion is not limited to an end portion of the piezoelectric power generating plate. Accordingly, it is possible to increase the degree of design freedom of the portion for fixing the support member to an external object.

Reference Signs List 1 piezoelectric power generating device
2, 42 piezoelectric power generating plate
2a, 2g, 2i, 2j, 2m, 2n, 2o, 2q, 2r, 2s, 2t cutout
2a1, 2a2, 2a3, 2g1, 2g2, 2g3, 2i1, 2i2, 2j1, 2j2 cutout component
2b, 2c short side
2d, 2e long side
2f second piezoelectric power generating plate portion
2h third piezoelectric power generating plate portion
2f1, 2h1 free end
2k1, 2k2 piezoelectric power generating plate portion
2p1, 2p2 piezoelectric power generating plate portion
2u first piezoelectric power generating plate portion
3 support member
4 metal plate
5 piezoelectric plate
6, 7 electrode
8 laminate
9 fixed portion
10 weight
21, 31, 41, 51, 61, 71 piezoelectric power generating device

The invention claimed is:

1. A piezoelectric power generating device comprising:
a support member; and
a piezoelectric power generating plate having:
a fixed portion attached to the support member,
a free end displaced relative to the fixed portion and configured to move relative to the fixed portion in response to an external force,
a cutout disposed between the fixed portion and the free end,
a first piezoelectric power generating plate portion disposed between the fixed portion and the free end, and
a second piezoelectric power generating plate portion disposed between the cutout and the free end.

2. The piezoelectric power generating device described in claim 1, wherein, in response to the external force, the first piezoelectric power generating plate portion and the second piezoelectric power generating plate portion are displaced in different directions.

3. The piezoelectric power generating device described in claim 1, wherein the piezoelectric power generating plate further comprises a piezoelectric plate having a plurality of polarized regions having different polarization directions.

4. The piezoelectric power generating device described in claim 3, wherein the plurality of polarized regions comprises two polarized regions having mutually opposite polarization directions.

5. The piezoelectric power generating device described in claim 1,
wherein the cutout has a frame shape with a portion thereof removed,
wherein the second piezoelectric power generating plate portion corresponds to a first portion surrounded by the cutout and the first piezoelectric power generating plate portion corresponds to a second portion separate from the first portion, and a connecting portion connects the first portion and the second portion, and
wherein the first portion is configured to move relative to the second portion in response to the external force.

6. The piezoelectric power generating device described in claim 5, wherein the second portion surrounded by the cutout includes a second cutout.

7. The piezoelectric power generating device described in claim 6, wherein the second piezoelectric power generating plate portion further comprises an inner portion surrounded by the second cutout having a second free end adjacent to the free end of the piezoelectric power generating plate.

8. The piezoelectric power generating device described in claim 1,
wherein the first piezoelectric power generating plate portion and the second piezoelectric power generating plate portion are disposed in a planar direction and are connected at a connection portion of the cutout, and
wherein the second piezoelectric power generating plate portion comprises a free end opposite the connecting portion of the cutout.

9. The piezoelectric power generating device described in claim 1, wherein the support member is attached to an end side of the piezoelectric power generating plate.

10. The piezoelectric power generating device described in claim 1, wherein the second piezoelectric power generating plate portion comprises at least one second cutout.

11. The piezoelectric power generating device described in claim 10, wherein the at least one second cutout comprises a plurality of cutouts, and adjacent cutouts of the plurality of cutouts are alternately disposed on opposite end edges in a direction parallel to the support member.

12. The piezoelectric power generating device described in claim 1, wherein the fixed portion is disposed in a central region between first and second ends of the piezoelectric power generating plate.

13. The piezoelectric power generating device described in claim 12, wherein one of the first and second ends is the free end of the piezoelectric power generating plate.

14. The piezoelectric power generating device described in claim 1, wherein the piezoelectric power generating plate is a unimorph type including a metal plate and a piezoelectric plate on the metal plate.

15. The piezoelectric power generating device described in claim 1, wherein the piezoelectric power generating plate is a bimorph type.

16. The piezoelectric power generating device described in claim 1, wherein the external force is a vibrating force.

* * * * *